(12) United States Patent
Hirayama et al.

(10) Patent No.: US 9,105,450 B2
(45) Date of Patent: Aug. 11, 2015

(54) PLASMA PROCESSING APPARATUS

(75) Inventors: Masaki Hirayama, Sendai (JP);
Tadahiro Ohmi, Sendai (JP)

(73) Assignees: TOHOKU UNIVERSITY (JP);
TOKYO ELECTRON LIMITED (JP)

( * ) Notice: Subject to any disclaimer, the term of this patent is extended or adjusted under 35 U.S.C. 154(b) by 363 days.

(21) Appl. No.: 13/145,398

(22) PCT Filed: Nov. 2, 2009

(86) PCT No.: PCT/JP2009/068748
§ 371 (c)(1),
(2), (4) Date: Aug. 12, 2011

(87) PCT Pub. No.: WO2010/084655
PCT Pub. Date: Jul. 29, 2010

(65) Prior Publication Data
US 2011/0303364 A1    Dec. 15, 2011

(30) Foreign Application Priority Data

Jan. 21, 2009 (JP) .................................. 2009-011455

(51) Int. Cl.
| C23C 16/00 | (2006.01) |
| C23F 1/00 | (2006.01) |
| H01L 21/306 | (2006.01) |
| H01J 37/32 | (2006.01) |

(52) U.S. Cl.
CPC ............................... *H01J 37/32192* (2013.01)

(58) Field of Classification Search
USPC .......................... 156/345.41, 345.35, 345.36;
118/723 MW, 723 ME
See application file for complete search history.

(56) References Cited

U.S. PATENT DOCUMENTS

| 5,788,798 | A | * | 8/1998 | Mabuchi et al. .......... 156/345.41 |
| 5,874,706 | A | * | 2/1999 | Ishii et al. ................ 219/121.43 |
| 2001/0050058 | A1 | | 12/2001 | Yamamoto et al. |

(Continued)

FOREIGN PATENT DOCUMENTS

| JP | 2001-192840 | 7/2001 |
| JP | 2003523116 | 7/2003 |

(Continued)

OTHER PUBLICATIONS

International Search Report—PCT/JP2009/068748 dated Dec. 28, 2009.

*Primary Examiner* — Rakesh Dhingra
(74) *Attorney, Agent, or Firm* — Cantor Colburn LLP

(57) ABSTRACT

A microwave plasma processing apparatus includes: a processing container wherein a gas is excited by microwaves and a substrate is plasma-processed; a microwave source which outputs microwaves; a transmission line through which the microwaves output from the microwave source are transmitted; a plurality of dielectric plates which are arranged on an inner surface of the processing container and emit the microwaves into the processing container; a plurality of first coaxial waveguides which are adjacent to the dielectric plates and through which the microwaves are transmitted to the dielectric plates; and a coaxial waveguide distributor which distributes and transmits the microwaves transmitted through the transmission line to the first coaxial waveguides. The coaxial waveguide distributor includes a second coaxial waveguide which has an input portion and 2 types of branched structures which are connected to the first coaxial waveguides and have different configurations.

14 Claims, 12 Drawing Sheets

(56) References Cited

U.S. PATENT DOCUMENTS

| | | | |
|---|---|---|---|
| 2002/0050486 A1* | 5/2002 | Ishii et al. | 219/121.43 |
| 2003/0168008 A1* | 9/2003 | Ohmi et al. | 118/715 |
| 2004/0107910 A1* | 6/2004 | Nakata et al. | 118/723 MW |
| 2005/0005853 A1* | 1/2005 | Behle et al. | 118/723 MW |
| 2009/0065480 A1* | 3/2009 | Ohmi et al. | 216/69 |
| 2010/0183827 A1 | 7/2010 | Hirayama et al. | |

FOREIGN PATENT DOCUMENTS

| | | | | |
|---|---|---|---|---|
| JP | 2005-116362 | 4/2005 | | |
| JP | 2005-310478 | 11/2005 | | |
| JP | 20070048718 | * 2/2007 | | H05H 1/46 |
| JP | 2008021465 | 1/2008 | | |
| JP | 2008-305736 | 12/2008 | | |
| TW | 491911 | 6/2002 | | |
| WO | 2008/153064 | 12/2008 | | |

* cited by examiner

SECTIONAL VIEW TAKEN ALONG LINE 1-1

SECTIONAL VIEW TAKEN ALONG LINE 4-4

SECTIONAL VIEW TAKEN ALONG LINE 2-2

FIG. 9

| S11 | 0.003 (138°) |
|-----|--------------|
| S12 | 0.446 (−119°) |
| S13 | 0.447 (−119°) |
| S14 | 0.447 (−119°) |
| S15 | 0.447 (−119°) |
| S16 | 0.447 (−119°) |

FIG. 10
(a) 4 X 2 CELLS
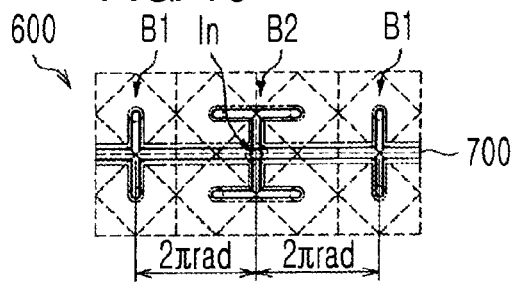
(b) 5 X 2 CELLS
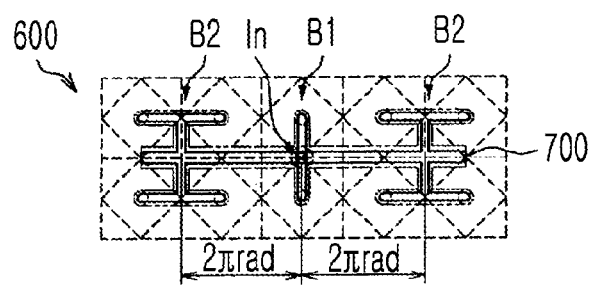
(c) 6 X 2 CELLS
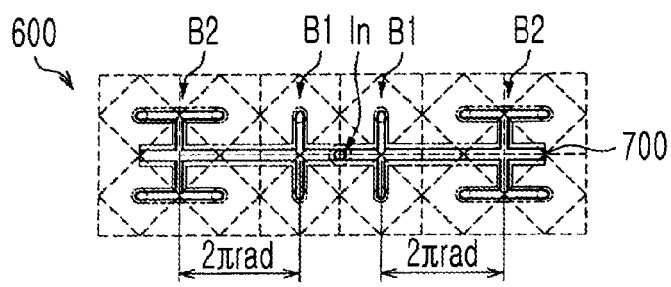
(d) 7 X 2 CELLS
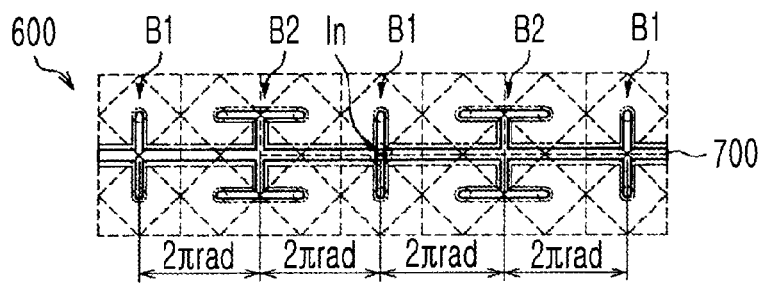
(e) 8 X 2 CELLS
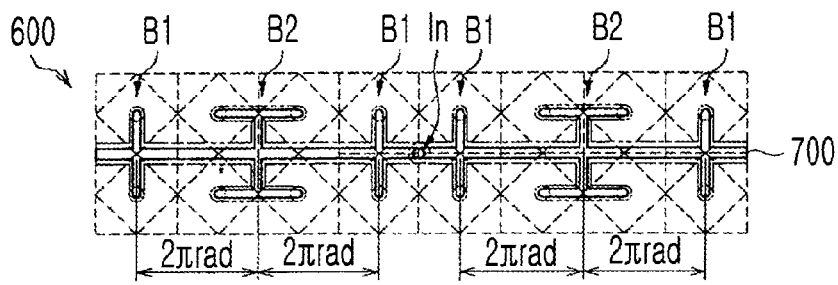

PLASMA PROCESSING APPARATUS

TECHNICAL FIELD

The present invention relates to a plasma processing apparatus that plasma-processes an object to be processed by exciting a gas by using electromagnetic waves. The present invention relates, more particularly, to branching of a coaxial waveguide through which electromagnetic waves are transmitted.

BACKGROUND ART

Recently, as a substrate gets larger, it is requested that a plasma processing apparatus get larger. In order to uniformly perform plasma processing on a substrate having a large area, it is preferable that a plurality of power supply points of electromagnetic waves are used. For example, in order to uniformly supply power in a large apparatus, a method of uniformly supplying electromagnetic waves to an entire ceiling surface of an apparatus by arranging a plurality of coaxial waveguides as power supply points in an array on the ceiling surface of the apparatus and supplying electromagnetic waves having the same amplitude and the same phase from the plurality of coaxial waveguides is suggested (see, for example, Patent Document 1). Accordingly, gas ionization or gas dissociation is accelerated uniformly on the entire ceiling surface, and thus plasma can be uniformly formed under the ceiling surface even if the apparatus is large and a good plasma process can be performed on the substrate by using the generated plasma.

[Patent Document 1] Japanese Laid-Open Patent Publication No. 2008-305736

DISCLOSURE OF THE INVENTION

Technical Problem

An example of a transmission line for performing power supply may be, for example, a path in which a main waveguide is branched into a plurality of branched coaxial waveguides having the same structure. In this case, electromagnetic waves input from an input portion are transmitted through the main waveguide, and are supplied from each of cells (each of metal electrodes) into an apparatus through each branched coaxial waveguide. Each cell is a virtual space obtained by dividing a ceiling surface into uniform rectangular regions. The cells may be obtained by dividing the ceiling surface into 12 regions.

In order to supply electromagnetic waves to each cell, lots of parts are required per cell. Meanwhile, the number of used parts is proportional to the number of cells but is not proportional to a size of each of the cells. Accordingly, costs may be reduced by reducing the number of the cells by increasing an area of each cell as much as possible.

Also, if a shape of each cell is square, there is no non-uniformity in an electric length strength distribution since horizontal symmetry and vertical symmetry of each cell are improved, and thus uniform plasma can be generated even when the cells are relatively large. Accordingly, plasma uniformity can be improved and costs can be reduced when the cells have a square shape and an area of each cell is relatively large.

However, in order to perform uniform plasma processing on a substrate, it is necessary to design a plasma processing apparatus such that a plasma excitation region is larger than the substrate in consideration of the fact that plasma density is reduced at an end portion of the substrate. That is, when designing a shape or a size of a cell, there is a limitation due to a size of a substrate. Also, if the cell is too large, metal surface waves propagating to a central portion of a metal surface of a metal electrode 94 or the like are severely attenuated, resulting in irregular plasma, and thus it may not be preferable to simply increase the size of the cell.

Accordingly, a plasma excitation region needs to be determined by setting an area of a cell to have a relatively large and appropriate size with respect to a preset size of a substrate. However, in a coaxial waveguide-branched structure such as explained above, because of a limitation that pitches of the branched coaxial waveguides should be constant or of other limitations, it is difficult to freely set a size of a cell.

An objective of the present invention is to provide a plasma processing apparatus having a branched structure of a coaxial waveguide distributor for transmitting microwaves which can increase a degree of freedom in setting a size of a cell.

Technical Solution

In order to solve the technical problem, according to an aspect of the present invention, there is provided a plasma processing apparatus for plasma-processing an object to be processed by exciting a gas by using electromagnetic waves, the plasma processing apparatus including: a processing container; an electromagnetic wave source which outputs electromagnetic waves; a transmission line which transmits the electromagnetic waves output from the electromagnetic wave source; a plurality of dielectric plates which are arranged on an inner surface of the processing container and through which the electromagnetic waves are emitted into the processing container; a plurality of first coaxial waveguides which are adjacent to the plurality of dielectric plates and through which the electromagnetic waves are transmitted to the plurality of dielectric plates; and a plurality of coaxial waveguide distributors each of which has one stage or two or more stages and distributes and transmits the electromagnetic waves transmitted through the transmission line to the plurality of first coaxial waveguides, wherein at least one of the plurality of coaxial waveguide distributors has more stages or less stages than other coaxial waveguide distributors. The at least one of the plurality of coaxial waveguide distributors has, for example, one stages, and the other coaxial waveguide distributors have, for example, two stages.

Also, according to another aspect of the present invention, there is provided a plasma processing apparatus for plasma-processing an object to be processed by exciting a gas by using electromagnetic waves, the plasma processing apparatus including: a processing container; an electromagnetic wave source which outputs electromagnetic waves; a transmission line through which the electromagnetic waves output from the electromagnetic wave source are transmitted; a plurality of dielectric plates which are arranged on an inner surface of the processing container and through which the electromagnetic waves are emitted into the processing container; a plurality of first coaxial waveguides which are adjacent to the plurality of dielectric plates and through which the electromagnetic waves are transmitted to the plurality of dielectric plates; and a coaxial waveguide distributor which has one stage or two or more stages and distributes and transmits the electromagnetic waves transmitted through the transmission line to the plurality of first coaxial waveguides, wherein at least one stage of the coaxial waveguide distributor includes: branched structures having configurations different from each other and respectively connected to the plurality of first coaxial waveguides; and a main coaxial waveguide to which the branched structures having the different configurations are connected.

Accordingly, the main coaxial waveguide of the coaxial waveguide distributor provided in the plasma processing apparatus is connected to the branched structures having configurations different from each other, and is connected to the plurality of first coaxial waveguides with the branched structures therebetween.

For example, the branched structures may include one or more first branched structures and one or more second branched structures, each of the first branched structures having a branched structure different from that of each of the second branched structures.

Each of the first branched structures may be connected to any of the plurality of first coaxial waveguides without a further branch.

Each of the second branched structures may be further branched to be connected to any of the plurality of first coaxial waveguides.

Each of the second branched structures may be of two stage branches.

In this configuration, since the branched structures having different configurations are connected to the main coaxial waveguide, positions of the first coaxial waveguides connected to branch ends may be optimally determined. Accordingly, each cell can be designed such that a plasma excitation region is larger than a substrate, each cell can have a substantially square shape, and an area of each cell can be relatively large. As a result, a plasma density at an end portion of the substrate may not be low, uniform plasma processing can be performed on the substrate, and a number of cells may be reduced. Accordingly, costs of the plasma processing apparatus can be reduced by reducing a number of parts.

The plasma processing apparatus may include a second coaxial waveguide having an input portion via which the second coaxial waveguide is connected to the main coaxial waveguide.

The first branched structures and the second branched structures may be alternately connected to the main coaxial waveguide.

The first branched structures and the second branched structures may be alternately connected to the main coaxial waveguide away from a connecting point between the second coaxial waveguide and the main coaxial waveguide.

A pitch between a connection portion where one or more first branched structures are connected to the main coaxial waveguide and a connection portion where one or more second branched structures are connected to the main coaxial waveguide may be $2\pi n$ rad (n is an integer) in an electric length.

A pitch between a connection portion where one or more first branched structures are connected to the main coaxial waveguide and a connection portion where one or more second branched structures are connected to the main coaxial waveguide may be $2\pi n$ rad (n is an integer) in an electric length, excluding a pitch around a connection portion where the second coaxial waveguide is connected to the main coaxial waveguide.

The first branched structure and the second branched structure may be connected to the main coaxial waveguide symmetrically about the second coaxial waveguide.

A first dielectric member may be buried in at least one of the plurality of first coaxial waveguides.

The first dielectric member may have a tapered shape.

The first dielectric member may be interposed between an inner conductor and an outer conductor of the first coaxial waveguide.

The first dielectric member may adjust a characteristic impedance of the first coaxial waveguide according to a shape of the first dielectric member.

An electric length of the first coaxial waveguide may be able to be adjusted according to a length of the first dielectric member.

The plurality of first coaxial waveguides may be connected at regular pitches respectively to the plurality of dielectric plates, and each pitch is $4\pi n/3$ rad (n is an integer) in reference to an electric length of the main coaxial waveguide.

Advantageous Effects

As described above, according to the present invention, since a coaxial waveguide distributor through which microwaves are transmitted includes different branched structures, a transmission line having a high degree of freedom can be formed and thus uniform plasma can be generated.

BRIEF DESCRIPTION OF THE DRAWINGS

FIG. 9 is a table showing an example of adjustment results according to the embodiment of the present invention;

FIG. 10 is a view showing a branch structure "a" having 8 cells, a branch structure "b" having 10 cells, a branched structure "c" having 12 cells, a branched structure "d" having 14 cells, and a branched structure "e" having 16 cells;

BEST MODE FOR CARRYING OUT THE INVENTION

Embodiments for Carrying out the Invention

Figure 1:
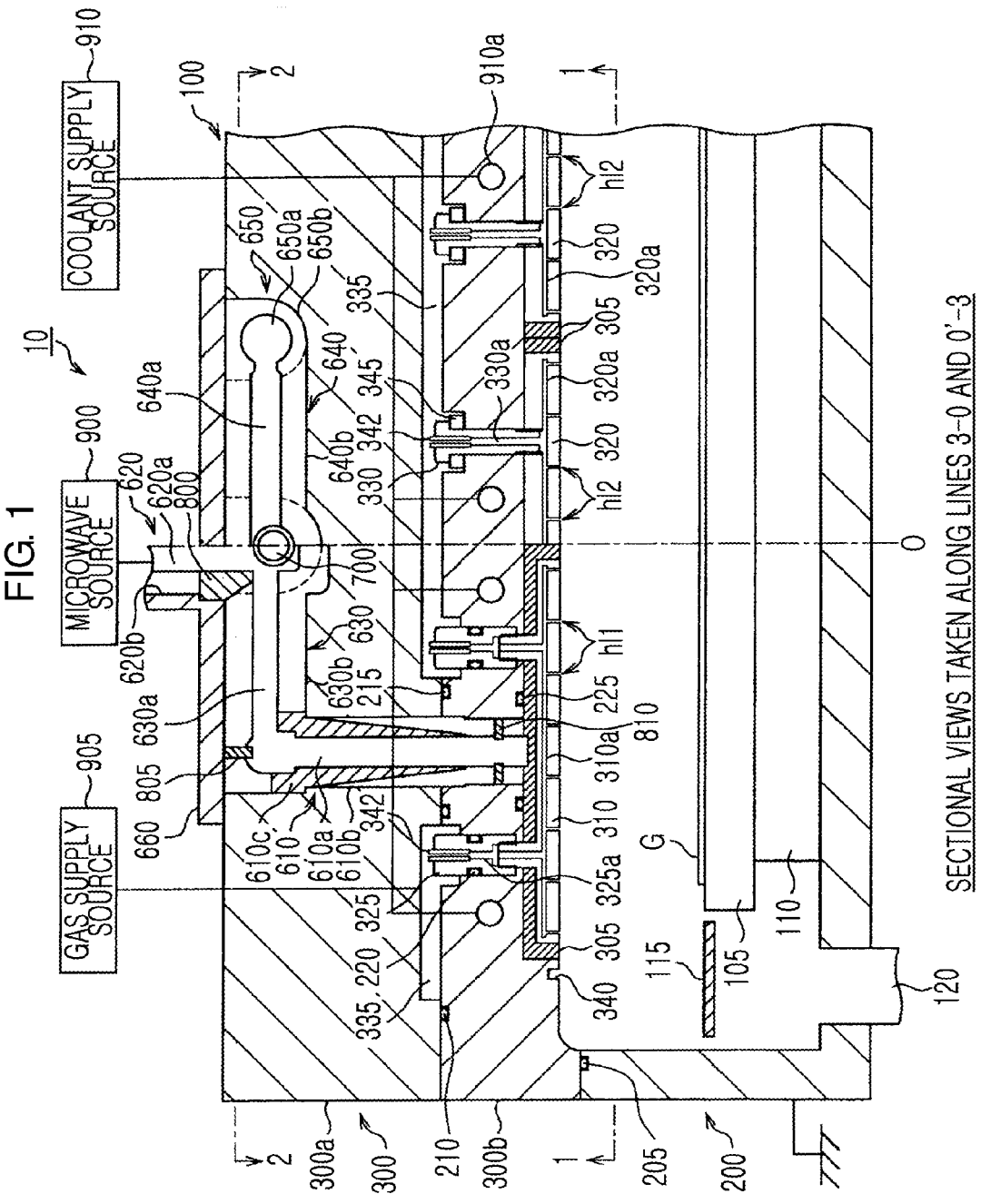
FIG. 1 is a magnified longitudinal-sectional view (sectional view taken along lines 3-0 and 0'-3) of a part of a plasma processing apparatus according to an embodiment of the present invention.

Very appropriate embodiments of the present invention will now be explained in detail with reference to the attached drawings. Also, in the specification and the drawings, elements having substantially the same functions and configurations are denoted by the same reference numerals and thus a repeated explanation thereof will not be given.

Also, a plasma processing apparatus according to each embodiment of the present invention described below will be explained in the following order.

<Embodiment>
[Configuration of Plasma Processing Apparatus]
(Overall Configuration)
(Configuration of Ceiling Surface)
(Transmission Line)
(Coaxial Waveguide Distributor and Branched Structure)
(First Dielectric member)
[Impedance Matching and Phase Adjustment Mechanism of Each Branched Structure]
(Characteristic Impedance Conversion/Phase Adjustment Unit)
(Impedance Matching)
(Impedance Matching of Second Branched Structure)
(Impedance Matching of First Branched Structure)
[Example of Effect]
<Modified Example of the Embodiment>
[Branched Structure According to Modified Example 1]
[Branched Structure According to Modified Example 2]
[Branched Structure According to Modified Example 3]
[Branched Structure According to Modified Example 4]
[Branched Structure According to Modified Example 5]
[Branched Structure According to Modified Example 6]

Embodiment

Configuration of Plasma Processing Apparatus

Figure 2:
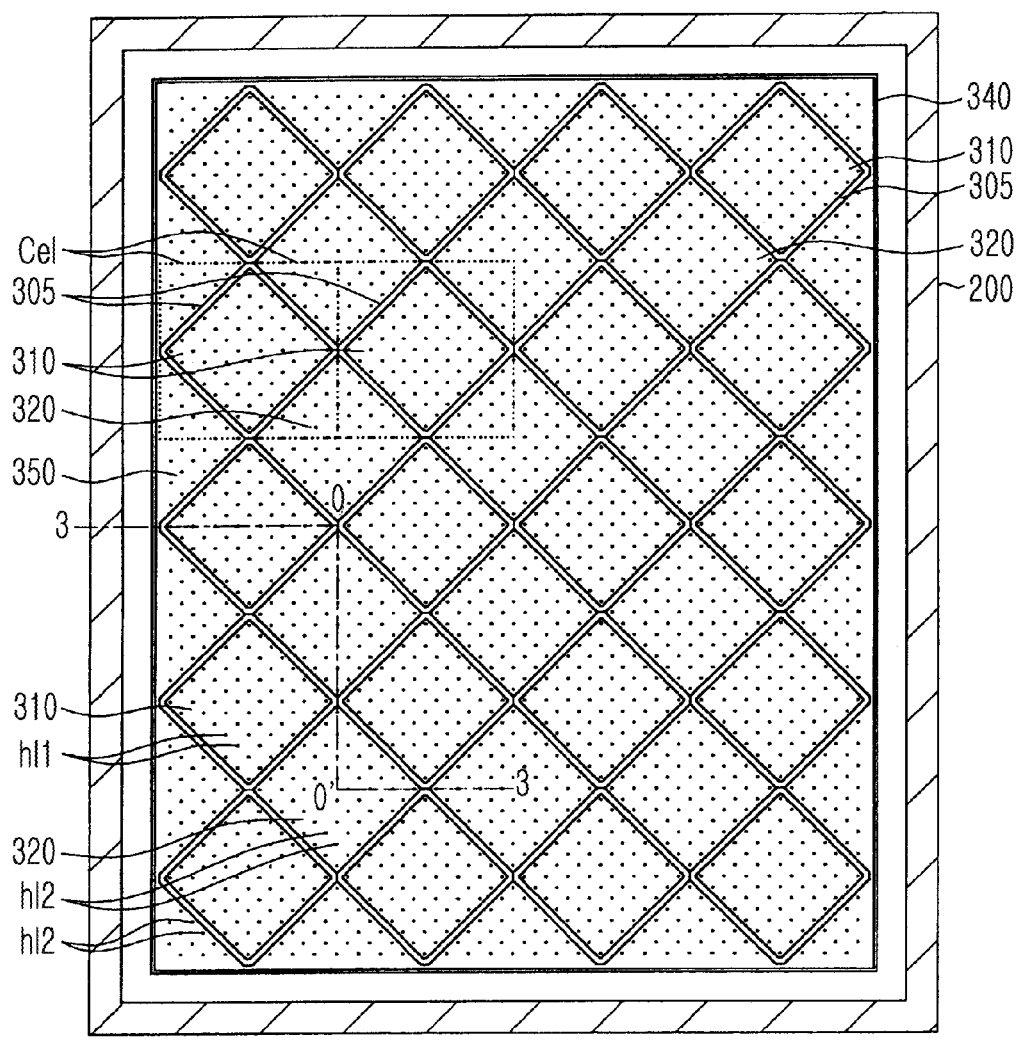
FIG. 2 is a view (sectional view taken along a line 1-1) showing a ceiling surface of the plasma processing apparatus according to the embodiment of the present invention.

First, a configuration of a microwave plasma processing apparatus according to an embodiment of the present invention will be explained with reference to FIGS. 1 and 2. FIG. 1 is a magnified longitudinal-sectional view (sectional views taken along lines 3-0 and 0'-3 in each of FIGS. 2 and 5) of a part of a microwave plasma processing apparatus 10 according to an embodiment of the present invention. FIG. 2 is a sectional view taken along a line 1-1 of FIG. 1, showing a ceiling surface of the microwave plasma processing apparatus 10.

(Overall Configuration)

As shown in FIG. 1, the microwave plasma processing apparatus 10 includes a processing container 100 for plasma-processing a glass substrate (hereinafter, referred to as a substrate G). The processing container 100 includes a container main body 200 and a cover 300. The container main body 200 has a cubic shape having an open top and a closed bottom, and the open top is covered by the cover 300. The cover 300 includes an upper cover 300a and a lower cover 300b. An O-ring 205 is provided on a contact surface between the container main body 200 and the lower cover 300b, and thus the container main body 200 and the lower cover 300b are sealed to define a processing chamber. Also, an O-ring 210 and an O-ring 215 are provided on a contact surface between the upper cover 300a and the lower cover 300b, and thus the upper cover 300a and the lower cover 300b are sealed. Each of the container main body 200 and the cover 300 is formed of a metal, for example, an aluminum alloy or the like, and is electrically grounded.

A susceptor 105 (stage) on which the substrate G is held is provided in the processing container 100. The susceptor 105 is formed of, for example, aluminum nitride. The susceptor 105 is supported by a support 110, and a baffle plate 115 for controlling a flow of a gas in the processing chamber in a desired state is provided around the susceptor 105. Via a gas exhaust pipe 120 provided in a bottom portion of the processing container 100, a gas in the processing container 100 is exhausted by using a vacuum pump (not shown) provided outside the processing container 100.

(Configuration of Ceiling Surface)

Referring to FIG. 2, dielectric plates 305, metal electrodes 310, and metal covers 320 are regularly arranged on a ceiling surface of the processing container 100. 20 dielectric plates 305 and 20 metal electrodes 310 are arranged at regular pitches, rotated at about 45° with respect to the substrate G or the processing container 100. Slightly cut edge portions of the dielectric plates 305 are arranged adjacent to one another. 12 metal covers 320 are disposed between the dielectric plates 305 and the metal electrodes 310.

A side cover 350 surrounding all of the metal electrodes 310 and the metal covers 320 is also provided on the ceiling surface. The dielectric plates 305, the metal electrodes 310, and the metal covers 320 are plates each having a substantially square shape and having slightly cut edges. The metal electrodes 310 are flat plates provided adjacent to the dielectric plates 305 such that the dielectric plates 305 are substantially uniformly exposed from outer peripheral portions of the metal electrodes 310. In this configuration, the dielectric plates 305 are sandwiched between an inner surface of the cover 300 and the metal electrodes 310, and thus are brought into close contact with an inner surface of the processing container 100. The metal electrodes 310 are electrically connected to an inner wall of the processing container 100.

Referring back to FIG. 1, thicknesses of the metal covers 320 are greater than thicknesses of the metal electrodes 310 by thicknesses of the dielectric plates 305. With this shape, a height of the ceiling surface is almost uniform. The dielectric plates 305 are formed of alumina, and the metal electrodes 310, the metal covers 320, and the side cover 350 are formed of an alumina alloy. Also, in the present embodiment, the number of the dielectric plates 305 and the number of the metal electrodes 310 are not limited, and may be increased or decreased to the same number.

The dielectric plates 305 and the metal electrodes 310 are fixed by screwing convex portions of the metal electrodes 310 which pass through the dielectric plates 305 to cap nuts 325 shown in FIG. 1. The metal covers 320 are fixed by screwing bolts 330 to recess portions formed in the metal covers 320 with washers 345 interposed between the bolts 330 and a recess surface of the lower cover 300b. Since O-rings 220 are provided between the cap nuts 325 and the lower cover 300b, a gas in a main gas passage 335 is prevented from being leaked into the processing container 100 without passing through gas passages 325a formed in the cap nuts 325.

The main gas passage 335 is provided in a direction vertical to the paper between the upper cover 300a and the lower cover 300b. The main gas passage 335 distributes a gas to the gas passages 325a provided in the plurality of cap nuts 325 and gas passages 330a formed in the plurality of bolts 330. Nozzles 342 for narrowing passages are provided in inlets of the gas passages 325 and 330a. The nozzles 342 are formed of a ceramic or a metal.

A gas passage 310a communicating with the gas passages 325a is provided in the metal electrodes 310, and front ends of the gas passage 310a are open as a plurality of gas holes h11. A gas passage 320a is formed in the metal covers 320 and the side cover 350, and front ends of the gas passage 320a are open as a plurality of gas holes h12. Front end surfaces of the nuts 325 and the bolts 330 are not exposed to surfaces of the metal electrodes 310, the metal covers 320, and the side cover 350 facing plasma in order not to disturb a distribution of plasma. As shown in FIG. 2, the gas holes h11 and the gas holes h12 are provided at regular pitches.

A gas output from a gas supply source 905 passes through the gas passages 325a and 330a from the main gas passage 335, passes through the first gas passage 310a provided in the metal electrodes 310 and the second gas passage 320a provided in the metal covers 320 or the side cover 350, and is supplied into the processing chamber from the gas holes h11 and h12.

As such, since a gas shower plate is formed on a metal surface of a ceiling portion, etching of a surface of a dielectric plate due to ions in plasma and accumulation of reactive products on an inner wall of a processing container, which occur in a conventional art, can be prevented, thereby reducing contamination and particles. Also, since a metal is easily processed unlike a dielectric, costs can be reduced greatly.

As shown in FIG. 2, the dielectric plates 305 are exposed between the metal covers 320, on which the dielectric plates 305 are not disposed, and the metal electrodes 310, which are adjacent to the dielectric plates 305 in a one-to-one manner. When a region having central points of metal covers 320 adjacent to one metal electrode 310 as vertexes is referred to as a cell Cel, the ceiling surface is virtually divided into uniform regions. In the ceiling surface, when each cell Cel is a unit, 20 cells having the same pattern are regularly arranged. Each cell Cel has a square shape.

Accordingly, power of microwaves is uniformly supplied from the cells. As a result, microwaves emitted from the dielectric plates 305 are converted into surface waves to halve power and propagate on surfaces of the metal electrodes 310 and the metal covers 320 with half power with respect to the metal electrodes 310 and the metal covers 320. Surface waves propagating between plasma and a metal surface of an inner surface of a processing container are referred to as metal surface waves hereinafter. Accordingly, metal surface waves propagate on the entire ceiling surface, and thus uniform plasma is stably generated under the ceiling surface of the microwave plasma processing apparatus 10 according to the present embodiment.

In the vicinity of boundaries of the outermost cells Cel, a groove 340 having a rectangular shape is provided to surround all of the metal electrodes 310, the dielectric plates 305, the metal covers 320, and the side cover 350. Metal surface waves propagating on the ceiling surface are prevented from propagating outside of the groove 340. One groove 340 may be provided as shown in the present embodiment, or two or three grooves may be provided.

A coolant supply source 910 shown in FIG. 1 is connected to a coolant pipe 910a inside the cover 300. Since a coolant supplied from the coolant supply source 910 circulates in the coolant pipe 910a and returns to the coolant supply source 910, the lower cover 300b of the cover 300 is prevented from being heated.

(Transmission Line)

Next, a transmission line through which microwaves are transmitted will be explained. A microwave source 900 outputs microwaves having a frequency of 915 MHz. A coaxial waveguide that transmits microwaves is buried in the cover 300. An inner conductor 610a is inserted into an outer conductor 610b of a first coaxial waveguide 610 that is formed by digging the cover 300. An end portion of the first coaxial waveguide 610 contacts each of the dielectric plates 305. As such, a plurality of the first coaxial waveguides 610 are provided to correspond in a one-to-one manner to the plurality of dielectric plates 305, and thus transmit microwaves to the plurality of dielectric plates 305.

Inner conductors 630a through 650a are inserted into outer conductors 630b through 650b of a third coaxial waveguide 630 through a fifth coaxial waveguide 650 that are formed by digging the cover 300 in the same manner, and upper portions of the inner conductors 630a through 650a are covered by a lid cover 660. A second coaxial waveguide 620 facing the microwave source 900 is connected to a main waveguide 700 of a coaxial waveguide distributor. A Teflon ring 800 (Teflon is a registered trademark) is provided on a connection portion between the second coaxial waveguide 620 and the main waveguide 700. An inner conductor 620a of the second coaxial waveguide 620 passes through the Teflon ring 800. The Teflon ring 800 fixes the inner conductor 620a to an outer conductor 620b, and prevents microwaves from being reflected during transmission. The inner conductor of each coaxial waveguide is formed of copper having high thermal conductivity.

O-rings 225 are provided on a contact surface between the dielectric plates 305 and the lower cover 300b around circumferences of the first coaxial waveguides 610, and thus air in the first coaxial waveguides 610 is prevented from entering the processing container 100.

Figure 3:
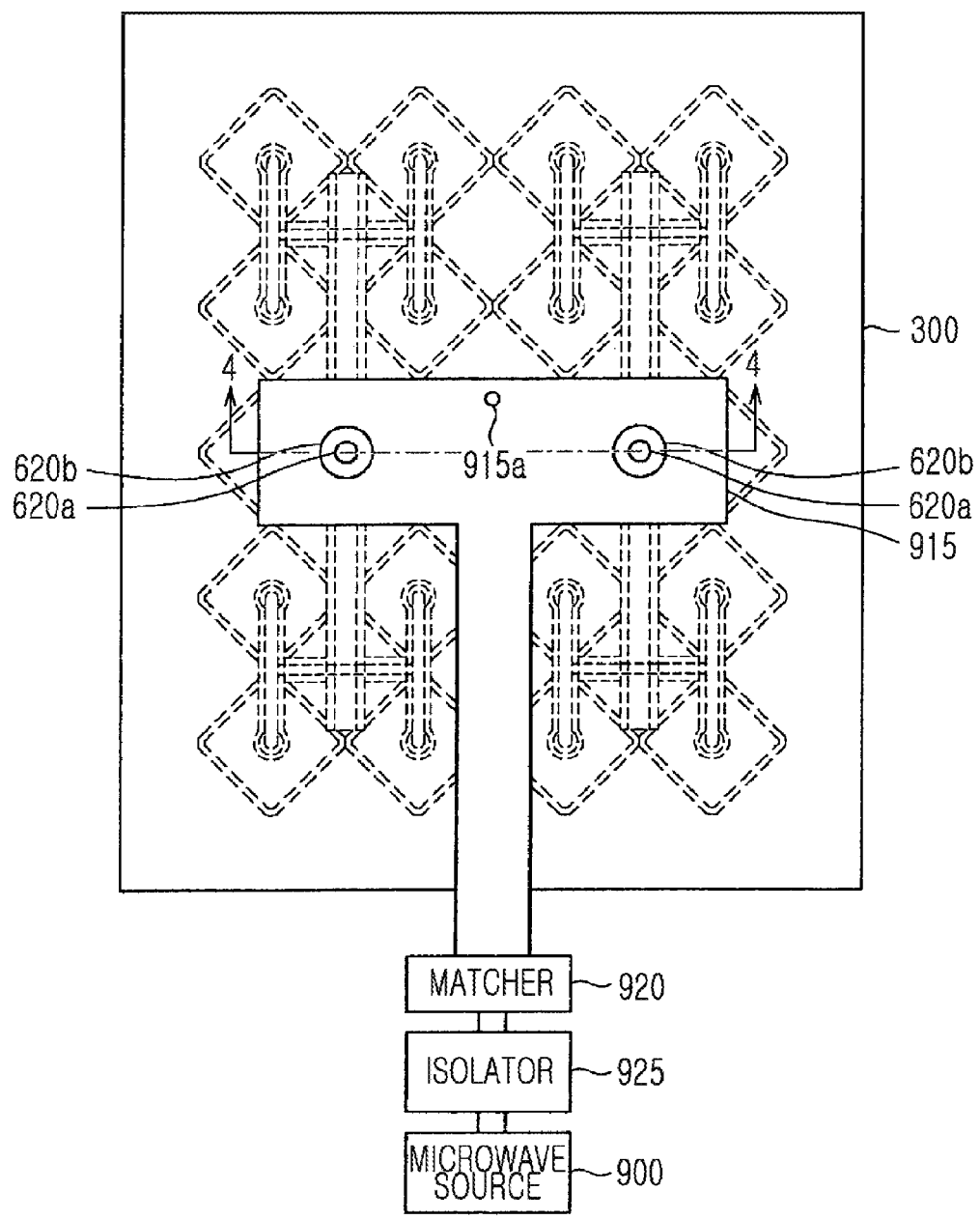
FIG. 3 is a view showing a waveguide, a microwave source, and so on disposed above a ceiling of the plasma processing apparatus according to the embodiment of the present invention.
Figure 4:
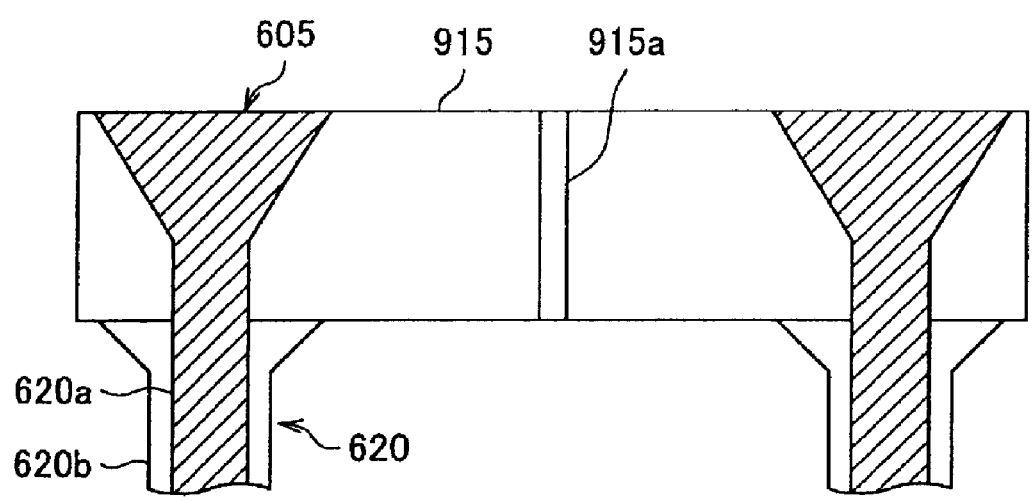
FIG. 4 is a view (sectional view taken along a line 4-4) showing a connection portion between the waveguide and a coaxial waveguide according to the embodiment of the present invention.

As shown in FIG. 3, a T-branch waveguide 915 is disposed over the cover 300. FIG. 4 is a sectional view taken along a line 4-4 of FIG. 3. As shown in FIG. 4, the T-branch waveguide 915 is connected to two second coaxial waveguides 620 through two coaxial waveguide converters 605 having tapered shapes. Since a bar-shaped member 915a for matching is provided inside a central portion of a branched portion of the T-branch waveguide 915, microwaves are well transmitted from the T-branch waveguide 915 to the second coaxial waveguides 620. Microwaves are output from the microwave source 900, impedances of a power source side and a load side are matched to each other due to a matcher 920, and microwaves are transmitted to the coaxial waveguides 620 while being prevented from being reflected by the coaxial waveguide converters 605 having tapered shapes. Also, since an isolator 925 is provided between the microwave source 900 and the matcher 920, reflected waves are prevented from returning to the microwave source 900 even when matching is not sufficiently achieved.

(Coaxial Waveguide Distributor and Branched Structure)

Figure 5:
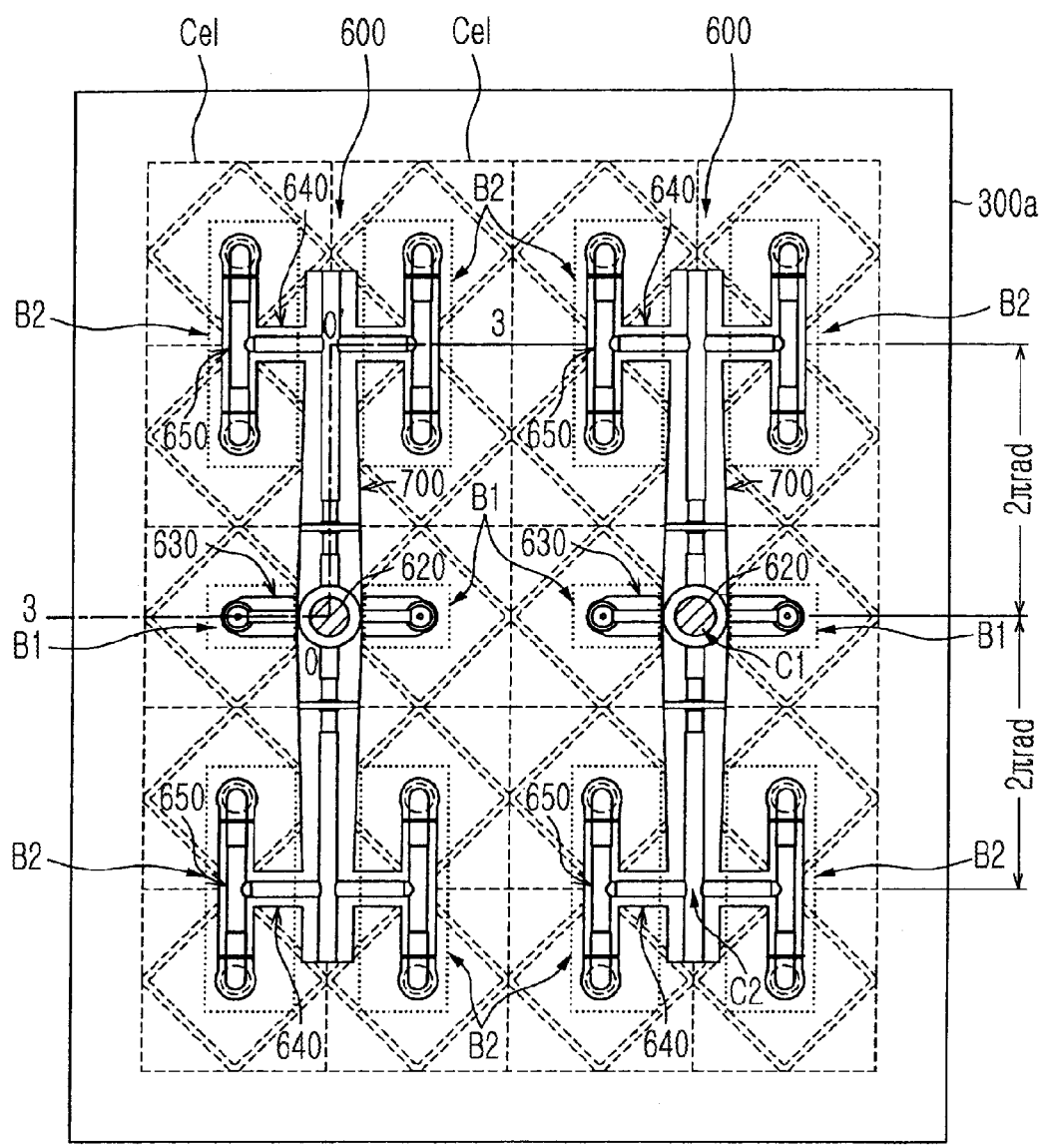
FIG. 5 is a plan view (sectional view taken along a line 2-2) showing a coaxial waveguide distributor and a branched structure according to the embodiment of the present invention.

FIG. 5 is a sectional view taken along a line 2-2 of FIG. 1. In the microwave plasma processing apparatus 10 according to the present embodiment, the ceiling surface is divided into 20 cells Cel and a substrate having a size of G4.5 (920 mm×730 mm) is processed.

In FIG. 5, two coaxial waveguide distributors 600 each of which distributes and transmits microwaves having been transmitted through the transmission line to the plurality of first coaxial waveguides 610 are buried in parallel to each other in the upper cover 300a. Each of the coaxial waveguide distributors 600 includes the main waveguide 700, the second coaxial waveguide 620, the third coaxial waveguides 630, the fourth coaxial waveguides 640, and the fifth coaxial waveguides 650.

Figure 6:
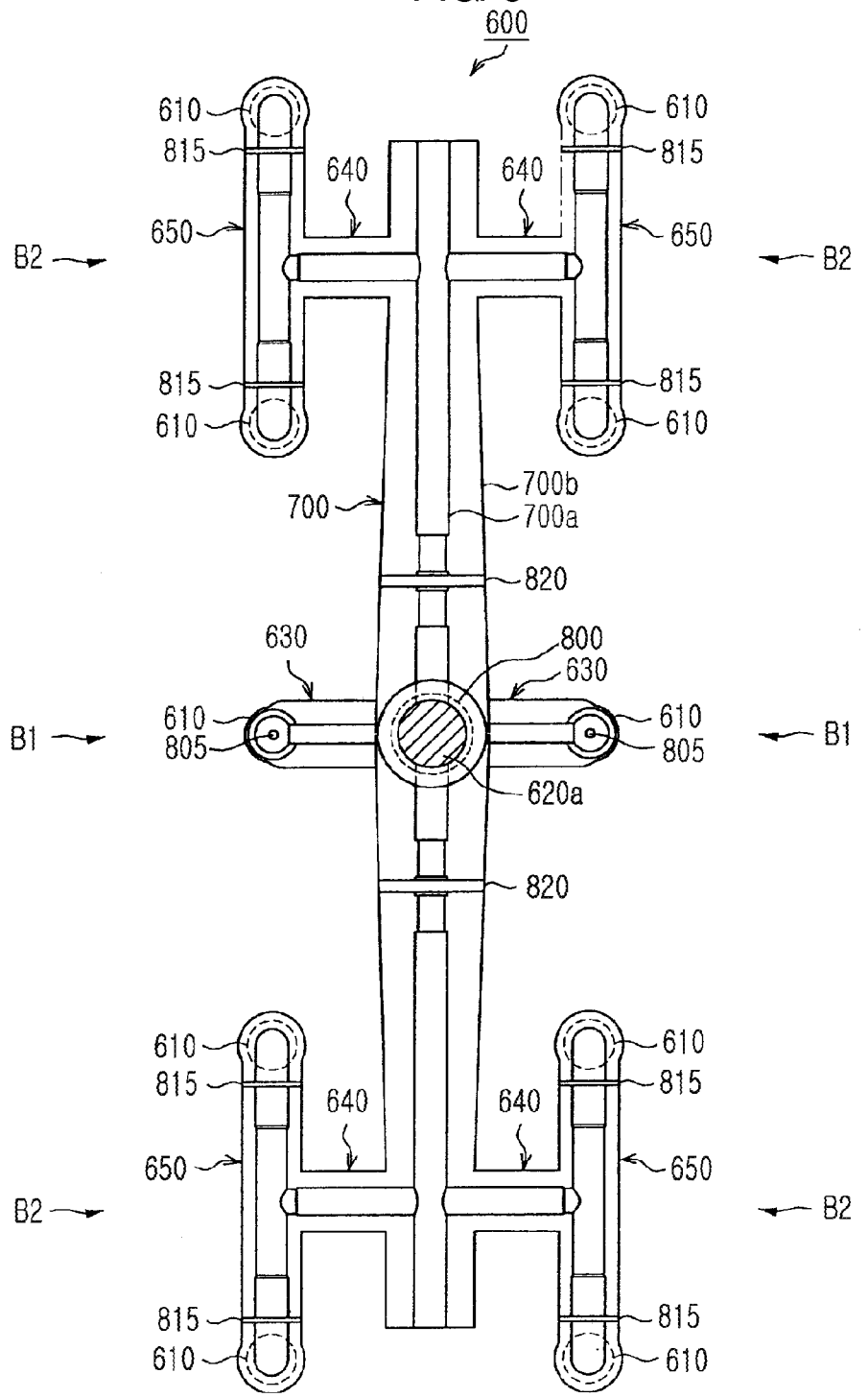
FIG. 6 is a plan view of the coaxial waveguide distributor according to the embodiment of the present invention.
Figure 7:
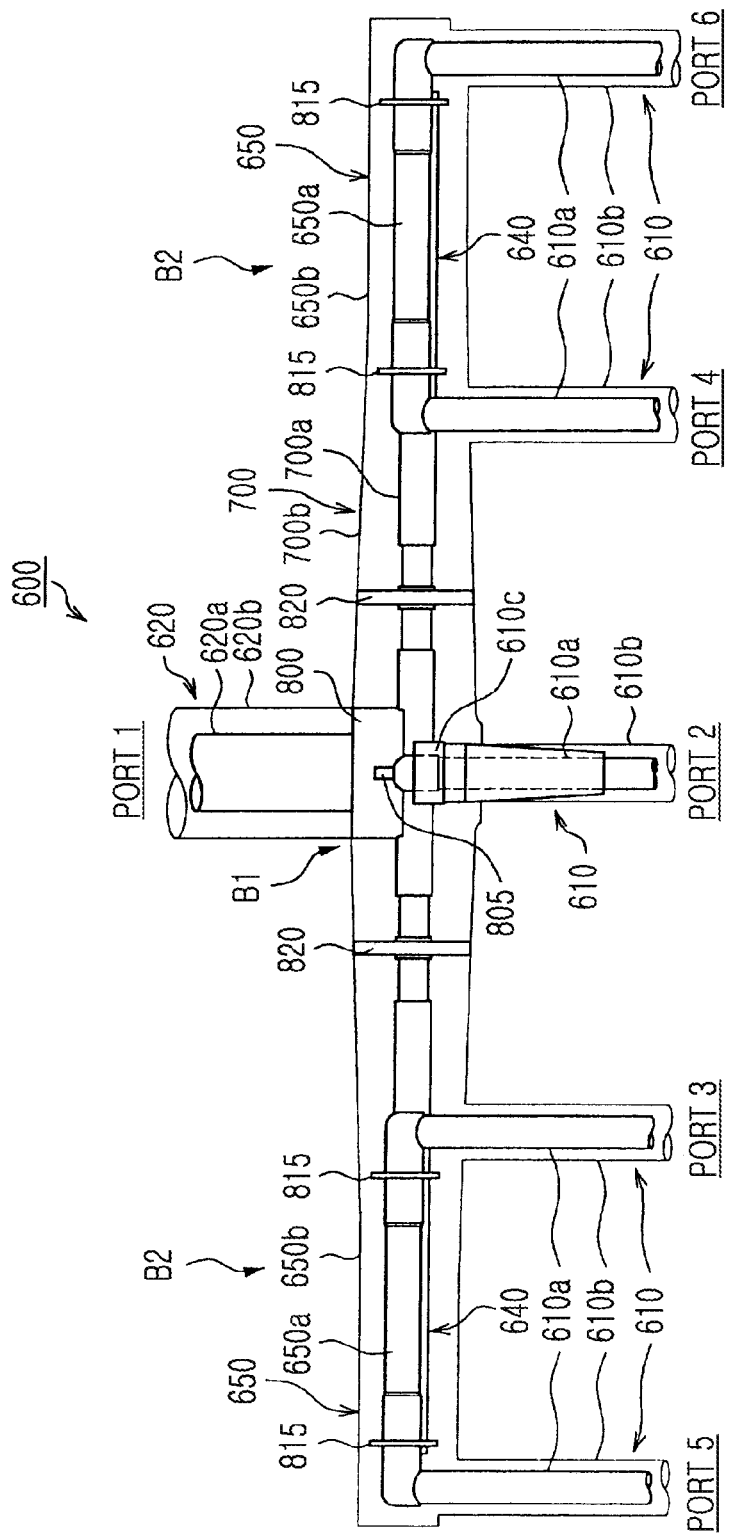
FIG. 7 is a side view of the coaxial waveguide distributor according to the embodiment of the present invention.

The coaxial waveguide distributor 600 will be further explained with reference to FIG. 6 showing a plan view of the coaxial waveguide distributor 600 and FIG. 7 showing a side view of the coaxial waveguide distributor 600. The coaxial waveguide distributor 600 has a first branched structure B1 and a second branched structure B2 each connected to the main waveguide 700, the second coaxial waveguide 620, and the plurality of first coaxial waveguides 610. The main waveguide 700 is a main coaxial waveguide connected to the second coaxial waveguide 620, the first branched structure B1, and the second branched structure B2. A thickness of an outer conductor 700b of the main waveguide 700 is increased toward a connection position between the main waveguide 700 and the second coaxial waveguide 620, and is decreased toward a connection portion between the main waveguide 700 and the fourth coaxial waveguides 640. Meanwhile, a thickness of an inner conductor 700a of the main waveguide 700 remains constant.

In the first branched structure B1, the third coaxial waveguides 630 are not branched and are directly connected to the first coaxial waveguides 610. That is, in the first branched structure B1, each of the third coaxial waveguides 630 which are connected to two ends of the coaxial waveguide distributor 600 is connected to one first coaxial waveguide 610 while being not branched.

In the second branched structure B2, two first coaxial waveguides 610 are connected to two ends of the fifth coaxial waveguide 650 T-branched from the fourth coaxial waveguide 640. That is, in the second branched structure B2, each of the fourth coaxial waveguides 640 connected to two sides of the coaxial waveguide distributor 600 is T-branched and is connected to the two first coaxial waveguides 610.

The first branched structure B1 and the second branched structure B2 are alternately connected to the main waveguide 700. The first branched structure B1 and the second branched structure B2 are connected to the coaxial waveguide distributor 600 symmetrically with respect to the second coaxial waveguide 620. Also, while the second coaxial waveguide 620 is connected to the main waveguide 700 at a center of the coaxial waveguide distributor 600, a position of the second coaxial waveguide 620 connected to the main waveguide 700 is not limited thereto. Also, at connection portions between the main waveguide 700 and the first branched structure B1 and between the main waveguide 700 and the second branched structure B2, two of the same branched structures are connected to one connection portion, different branched structures may be connected to one connection portion, or any number other than 2 branched structures may be connected to one connection portion. Also, although the inner conductor 700a and the inner conductor 640a, and the inner conductor 700a and the inner conductor 630a are perpendicular to each other in the present embodiment, the inner conductor 700a and the inner conductor 640a, and the inner conductor 700a and the inner conductor 630a may not be perpendicular to each other.

(First Dielectric Member)

A first dielectric member 610c having a tapered shape is buried in the first coaxial waveguide 610 (a coaxial waveguide of the first branched structure) shown in FIG. 1. The first dielectric member 610c having a tapered shape is interposed between the inner conductor 610a and the outer conductor 610b of the first coaxial waveguide 610 and is formed and disposed in an inverted tapered shape from a connection portion between the first coaxial waveguide 610 and the third coaxial waveguide 630 toward a lower end portion of the first coaxial waveguide 610. In the connection portion between the third coaxial waveguide 630 and the first coaxial waveguide 610, an outer conductor is formed to have a large space and an inner conductor is formed to have an almost round shape. Accordingly, microwaves are prevented from being reflected at a branched portion, and the first dielectric member 610c having a tapered shape is fixed. The first dielectric member 610c having a tapered shape is formed of a dielectric such as quartz, alumina, yttria, or the like.

As such, since the first dielectric member 610c is formed to have a tapered shape, a characteristic impedance of the first coaxial waveguide 610 can be converted. Also, a phase of microwaves that are transmitted through the first coaxial waveguide 610 can be adjusted by adjusting a length of the first dielectric member 610c. Characteristic impedance conversion and phase adjustment will be explained later.

A space between an inner conductor and an outer conductor over the connection portion of the first coaxial waveguide 610 is supported by a Teflon rod 805. A Teflon ring 810 is provided in the vicinity of a front end of the first coaxial waveguide 610, and thus the inner conductor 610a is supported on the outer conductor 610b. Likewise, a Teflon ring 815 is provided on the fifth coaxial waveguide 650, and thus the inner conductor 650a is supported on the outer conductor 650b. Each of the Teflon rod 805 and the Teflon rings 810 and 815 is formed of a dielectric such as Teflon (registered trademark), Teflon containing glass, quartz, alumina, yttria, or the like.

A Teflon ring 820 is also provided between the inner conductor 700a and the outer conductor 700b of the main waveguide 700. The Teflon ring 820 is formed of Teflon. The Teflon ring 820 supports the inner conductor 700a on the outer conductor 700b, and an electric length of microwaves is adjusted by adjusting a relative permittivity and a thickness of the Teflon ring 820. The Teflon ring 820 is not limited to Teflon, and may be formed of a dielectric such as Teflon containing glass, quartz, alumina, yttria, or the like.

An impedance of plasma as a load varies according to process conditions. Accordingly, it is impossible in principle to have no reflection from a load. Even though there is a reflection from a load, a branched line for supplying microwaves having the same amplitude and the same phase to each cell needs to be designed. Accordingly, in order to match voltages and phases of microwaves at a connection portion C1 and connection portions C2 despite the reflection from the load, an electric length between the connection portion C1 and each of the connection portions C2 is integer times $2\pi$ rad (one time in the present embodiment) (see FIGS. 5 and 8).

In the present embodiment, since the first branched structure B1 and the second branched structure B2, which are different types, are provided and thus electric lengths thereof are different from each other, phases of microwaves supplied to cells cannot be the same only by adjusting phases of microwaves at the connection portion C1 and the connection portions C2 to be same. Accordingly, a phase adjustment unit, which will be explained later, is provided in the first branched structure B1.

The first coaxial waveguides 610 connected to an end of the first branched structure B1 and the first coaxial waveguides 610 connected to an end of the second branched structure B2 are connected at regular pitches to the plurality of metal electrodes 310. Each pitch is $4\pi n/3$ rad (n is an integer) based on an electric length of the main waveguide 700.

However, 1.5 times a cell pitch is almost equal to but is slightly different from a wavelength of microwaves in a hollow coaxial waveguide (which is equal to a wavelength in free space). Accordingly, as shown in FIGS. 6 and 7, an electric length between the connection portion C1 and each of the connection portions C2 is $2\pi$ rad by interposing the Teflon 820 between the inner conductor 700a and the outer conductor 700b of the main waveguide 700. A cell pitch can be relatively freely determined by using such adjustment means.

[Impedance Matching and Phase Adjustment Mechanism of Each Branched Structure]

Figure 8:
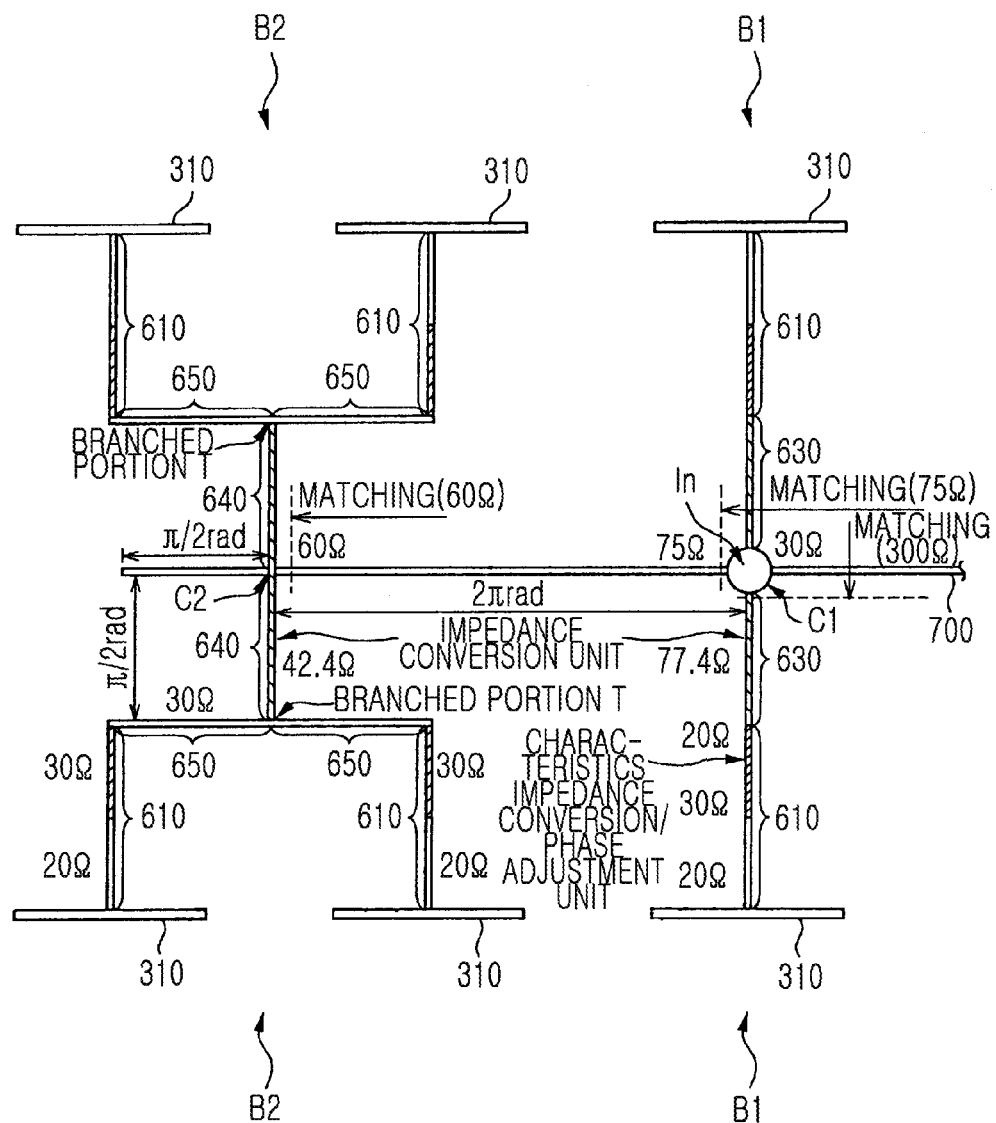
FIG. 8 is a view for explaining impedance adjustment and phase adjustment of the coaxial waveguide distributor according to the embodiment of the present invention.

Next, an impedance matching and phase adjustment mechanism of each branched structure will be explained with reference to FIG. 8. FIG. 8 is a view schematically showing the first branched structure B1 and the second branched structure B2. In FIG. 8, the second branched structure B2 on a right side of an input portion In is not shown.

(Characteristic Impedance Conversion/Phase Adjustment Unit)

The first dielectric member 610c converts a characteristic impedance to have an appropriate value by using its tapered shape and adjusting its length while preventing microwaves from being reflected, and makes phases of microwaves supplied to all cells same as each other by adjusting an electric length of the first branched structure B1.

A characteristic impedance of a coaxial waveguide is defined by Equation 1.

[Equation 1]

$$Z_0 = 138/\sqrt{\in_r} \cdot \log \sqrt{b/a} \qquad (1)$$

where '$\in_r$' is an effective relative permittivity of the first dielectric member 610c, 'b' is a diameter of the outer conductor 610b of the first coaxial waveguide 610, and 'a' is a diameter of the inner conductor 610a of the first coaxial waveguide 610.

According to Equation 1, in order to convert a characteristic impedance of the first coaxial waveguide 610, any of the effective relative permittivity '$\in_r$' of the first dielectric member 610c, the diameter of the outer conductor 610b, and the diameter of the inner diameter 610a may be changed.

In the present embodiment, as shown in FIG. 1, the effective relative permittivity '$\in_r$' of the first dielectric member 610c is changed without changing the diameter of the outer conductor 610b and the diameter of the inner conductor 610a. In detail, the first dielectric member 610c is formed to have an inverted tapered shape such that an upper portion of the first dielectric member 610c is thick and a lower portion of the first dielectric member 610c is thin. Also, quartz having a relative permittivity '$\in_r$' of 3.8 is used for the first dielectric member 610c. Since a space between the outer conductor 610b and the inner conductor 610a in an upper portion of the first coaxial waveguide 610 is filled with the first dielectric member 610c, a relative permittivity between the inner and outer conductors is almost equal to 3.8. Meanwhile, toward a lower portion of the first coaxial waveguide 610, a volume of air filled in the space between the inner and outer conductors is greater than a volume of quartz filled in the space. Accordingly, the effective relative permittivity '$\in_r$' between the inner and outer conductors of the first coaxial waveguide 610 is gradually reduced from 3.8. According to Equation 1, when there is no change in the variables a and b and the effective relative permittivity '$\in_r$' is gradually reduced, a characteristic impedance $Z_0$ is gradually increased. Accordingly, the characteristic impedance $Z_0$ is increased toward the lower portion from the upper portion of the first dielectric member 610c. As such, a characteristic impedance of microwaves can be converted into a desired value by using the first dielectric member 610c. In FIG. 8, a characteristic impedance (30Ω) of the lower portion of the first coaxial waveguide 610 where the first dielectric member 610c is disposed is converted into a characteristic impedance (20Ω) of the upper portion of the first coaxial waveguide 610 by using a characteristic conversion/phase adjustment unit realized by the first dielectric member 610c.

Also, a phase of microwaves is delayed as a relative permittivity is increased. Accordingly, a phase of microwaves is delayed as a length of a tapered portion of the first dielectric member 610c is increased. An electric length of the first branched structure B1 is adjusted based on this principle.

In the present embodiment, microwave phase adjustment and characteristic impedance conversion are simultaneously performed by forming quartz in a tapered shape. Also, according to a design, there is a case where there is no difference in phases of microwaves supplied to cells even without a phase adjustment unit. In this case, phase adjustment is unnecessary. Also, when only a phase needs to be adjusted without converting a characteristic impedance, the dielectric member 610c may be formed in a straight shape, not in a tapered shape.

In another configuration of a characteristic impedance conversion/phase adjustment unit, for example, the inner conductor 610a or the outer conductor 610b may have a tapered shape and a dielectric such as quartz or the like may be filled between the inner and outer conductors. Since the first dielectric member 610c does not need to have a tapered shape, processing costs can be reduced. Also, a characteristic impedance conversion/phase adjustment unit may be provided in the second branched structure B2.

(Impedance Matching)

Impedance matching between the first branched structure B1 and the second branched structure B2 in the present embodiment will be explained based on a function of the above-described characteristic impedance conversion/phase adjustment unit.

As described above, in order to generate uniform plasma, the same power (power having the same amplitude) needs to be supplied to all cells. Here, the second branched structure B2 is divided into two branches and is connected to 4 metal electrodes 310. Meanwhile, the first branched structure B1 is not branched and is directly connected to one metal electrode 310. As such, if loads on ends of branched structures are different, power of microwaves supplied to cells (metal electrodes 310) cannot be equally distributed unless a ratio of power of microwaves supplied to the main waveguide 700 extending left and the main waveguide 700 extending right from the input portion In and power of microwaves supplied to a coaxial waveguide extending up and a coaxial waveguide extending down is 4:1.

In order to distribute power of microwaves as described above, each of a characteristic impedance obtained by seeing the main waveguide 700 extending left and a characteristic impedance obtained by seeing the main waveguide 700 extending right from the input portion In is set to be 75Ω, and each of a characteristic impedance obtained by seeing the third coaxial waveguide 630 extending up and a characteristic impedance obtained by seeing the third coaxial waveguide 630 extending down from the input portion In is set to be 300Ω, which may be calculated as follows.

It is assumed that all of impedances obtained by seeing 4 coaxial waveguides connected to the input portion In from the input portion In are resistive. The following equation is established for each of coaxial waveguides extending in a horizontal direction.

$P_1$ (power supplied to a coaxial waveguide extending in a horizontal direction)=$V^2$ (a voltage of the input portion In)/$R_1$ (a resistance obtained by seeing the coaxial waveguide extending in the horizontal direction)

The following equation is established for each of coaxial waveguides extending in a vertical direction.

$P_2$ (power supplied to a coaxial waveguide extending in a vertical direction)=$V^2$ (a voltage of the input portion In)/$R_2$ (a resistance obtained by seeing the coaxial waveguide extending in the vertical direction)

Accordingly, Equation 2 is derived.

$$P_1/P_2 = 4/1 = R_2/R_1 \qquad (2)$$

Also, in order to prevent a reflection in the input portion In, a total impedance of four branch ends connected in parallel may be matched to a characteristic impedance of the second coaxial waveguide 620 of a branch source. In the present embodiment, in order to minimize power loss in a coaxial waveguide, a characteristic impedance of the second coaxial waveguide 620 is set to be 30Ω. Accordingly, Equation 3 is established.

$$1/(1/R_1+1/R_1+1/R_2+1/R_2)=30\Omega \quad (3)$$

From Equations 2 and 3, $R_1=75\Omega$ and $R_2=300\Omega$ are derived. Based on the above calculation, a characteristic impedance of each coaxial waveguide is determined such that each of an impedance obtained by seeing a left waveguide and an impedance obtained by seeing a right waveguide from the input portion In is 75Ω and each of an impedance obtained by seeing an upper waveguide and an impedance obtained by seeing an lower waveguide from the input portion In is 300Ω.

(Impedance Matching of Second Branched Structure)

First, impedance matching on the second branched structure B2 will be explained. In order to prevent electric field concentration and a reflection from a load side, a characteristic impedance of a lower portion of the first coaxial waveguide 610 connected to the metal electrode 310 of each cell is set to, for example, 20Ω. Then, a stepped portion is provided on the inner conductor 610a of the first coaxial waveguide 610 such that a characteristic impedance of an upper portion of the first coaxial waveguide 610 is 30Ω. Also, a reflection is reduced by adjusting a length of the lower portion of the first coaxial waveguide 610. Also, a characteristic impedance of the fifth coaxial waveguide 650 is 30Ω to be the same as the characteristic impedance of the upper portion of the first coaxial waveguide 610.

In order for an impedance obtained by seeing a left side from the input portion In to be 75Ω, a characteristic impedance of the main waveguide 700 in the vicinity of the input portion In is 75Ω and a load impedance is matched to 75Ω. Here, the outer conductor 700b of the main waveguide 700 is gradually thinned to have a tapered shape, and a characteristic impedance of the main waveguide 700 in the vicinity of a connection portion between the main waveguide 700 and the second branched structure B2 is 60Ω, in order to adjust an electric length of the fourth coaxial waveguide 640 to a desired length. However, the main waveguide 700 does not have to have such a tapered shape.

In order to match a load impedance, an impedance obtained by seeing the fourth coaxial waveguides 640 from the connection portion C2 needs to be 2 times a characteristic impedance of 60Ω of the main waveguide 700. This is because two fourth coaxial waveguides are connected to the connection portion C2.

Also, an electric length between each of end portions of the main waveguide 700 and a connection portion of a branched structure closest to each of the end portions is about odd times π/2 rad (here, one time). Accordingly, the space between each of the end portions of the main waveguide 700 and the connection portion of the branched structure closest to each of the end portions may be regarded as a distributed parameter line having an end short-circuited. As such, when a distributed parameter line having an electric length of π/2 rad and having an end short-circuited is seen from another end of the distributed parameter line, an impedance seems to be infinite. Accordingly, since the space between each of the end portions of the main waveguide 700 and the connection portion does not almost exist in terms of transmission of microwaves, a transmission line can be easily designed.

A total impedance obtained by seeing two fifth coaxial waveguides 650 from a branched portion T is ½ of a characteristic impedance (30Ω) of the fifth coaxial waveguide 650.

Each of the fourth coaxial waveguides 640 functions as an impedance converter for satisfying a relationship between these impedances, and an electric length and a characteristic impedance of each of the fourth coaxial waveguide 640 are designed as follows. First, an electric length of each of the fourth coaxial waveguides 640 is set to be π/2 rad. Also, a characteristic impedance $Z_{c4}$ of the fourth coaxial waveguides 640 may be obtained by the following equation.

[Equation 2]

$$Z_{c4}=\sqrt{Z_{c7} \cdot Z_{c5}} \quad (4)$$

where $Z_{c7}$ is a characteristic impedance of the main waveguide 700 (in the vicinity of a branched portion C2) and $Z_{c5}$ is a characteristic impedance of the coaxial waveguides 650. When $Z_{c7}=60\Omega$ and $Z_{c5}=30\Omega$ in Equation 4, $Z_{c4}=42.4\Omega$.

(Impedance Matching of First Branched Structure)

Next, impedance matching on the first branched structure B1 will be explained. Like impedance matching of the second branched structure, in order to prevent electric length concentration and a reflection from a load side, a characteristic impedance of a lower portion of the first coaxial waveguide 610 connected to the metal electrode 310 of each cell is set to 20Ω. Then, a stepped portion is provided on the inner conductor 610a of the first coaxial waveguide 610 such that a characteristic impedance of an upper portion of the first coaxial waveguide 610 is 30Ω, and a length of a lower portion of the first coaxial waveguide 610 is adjusted so that reflection is not generated.

A characteristic impedance conversion/phase adjustment unit of the first coaxial waveguide 610 is configured such that, as described above, the first dielectric member 610c having an inverted tapered shape is provided between the inner conductor 610a and the outer conductor 610b. In this configuration, a characteristic impedance may be gradually reduced from an output side of an upper first coaxial waveguide 610 toward an input side of an upper first coaxial waveguide 610 according to Equation 1 by gradually increasing a relative permittivity '$\varepsilon_r$' from the output side of the upper first coaxial waveguide 610 toward the input side of the upper first coaxial waveguide 610 by using an inverted tapered portion of the first dielectric member 610c. Accordingly, a reflection can be prevented and a characteristic impedance at the output side of the upper first coaxial waveguide 610 can be 30Ω and a characteristic impedance of the input side of the upper first coaxial waveguide 610 can be 20Ω.

Meanwhile, as described above, each of an impedance $Z_{in}$ obtained by seeing an upper coaxial waveguide and an impedance $Z_{in}$ obtained by seeing a lower coaxial waveguide from the input portion In must be 300Ω. Each of the third coaxial waveguides 630 functions as an impedance converter for satisfying a relationship between these impedances, and an electric length and a characteristic impedance of each of the third coaxial waveguides 630 are designed as follows. First, an electric length of each of the third coaxial waveguides 630 is set to be π/2 rad. Also, a characteristic impedance $Z_{c3}$ of the third coaxial waveguides 630 may be obtained by using the following equation.

[Equation 3]

$$Z_{c3}=\sqrt{Z_{in} \cdot Z_{c1}} \quad (5)$$

where $Z_{c1}$ is a characteristic impedance of an upper characteristic impedance conversion unit of the coaxial waveguide 610. When $Z_{in}=300\Omega$ and $Z_{c1}=20\Omega$ in Equation 5, $Z_{c3}=77.4\Omega$.

Example of Effect

As described above, in a branch circuit of the coaxial waveguide distributor 600 for optimizing a branched structure, a reflection state and a phase state were obtained through a simulation. FIG. 9 shows incidence, reflection, and transmission states of microwaves in each of ports shown in FIG. 7 by using S parameters. FIG. 9 shows the results. S11 shows microwaves input from a port 1 and output from the port 1. That is, S11 shows reflected waves and a phase (in parentheses) of microwaves output from the port 1. Here, an amplitude of microwaves reflected from the port 1 is 0.003, which is almost equal to 0, and thus is very small Next, S12 through S16 will be verified. S12 through S16 show microwaves input from the port 1 of FIG. 7 and respectively output from ports 2 through 6. According to a result of the simulation, amplitudes of microwaves output from the ports 2 through 6 are 0.446 or 0.447, which are almost the same. Also, phases of microwaves output from the ports 2 through 6 are all −119°, which are the same. As a result, even in a transmission path having different branched structures, that is, the first branched structure B1 and the second branched structure B2, it is verified that microwaves having the same amplitude and the same phase can be supplied to a processing container. Accordingly, the microwave plasma processing apparatus 10 can be designed relatively without limitations in a substrate size and the number of cells (that is, the number of branches).

In other words, positions of the first coaxial waveguides 610 can be optimally determined by connecting the first branched structure B1 and the second branched structure B2 having different configurations to the main waveguide 700 of the coaxial waveguide distributor 600. As a result, a cell Cel can have a square shape when a substrate G has a preset size, and an area of the cell Cel can be relatively large. As a result, uniform plasma processing can be performed on the substrate G by allowing the cell Cel to have a square shape, and costs can be reduced by relatively increasing an area of the cell Cel.

Modified Example of First Embodiment

Branched Structure According to Modified Example 1

As shown in FIG. 10 "b", based on a branched structure having 10 branches (there are 10=(5×2) cells) described above, modified examples of FIG. 10 "a", and FIG. 10 "c" through FIG. 10 "e" may be examined. For example, in a branched structure according to the modified example 1 shown in FIG. 10 "a", the second branched structures are disposed on the second coaxial waveguide (the input portion In) and the first branched structures B1 are symmetrically disposed about the main waveguide 700 of the coaxial waveguide distributor 600 on two sides of the second branched structure B2. That is, the first branched structures B1 and the second branched structures B2 are connected to the main waveguide 700 in the order of the second branched structures B2 and the first branched structures B1 from the second coaxial waveguide (input portion In) toward both sides of the second coaxial waveguide. In this case, there are 8 (=4×2) cells.

A pitch between a connection portion where a first branched structure B1 is connected to the main waveguide 700 of the coaxial waveguide distributor 600 and a connection portion where a second branched structure B2 is connected to the main waveguide 700 of the coaxial waveguide distributor 600 is 2πn rad (n is an integer, and here, n=1).

Branched Structure According to Modified Example 2

In a branched structure according to the modified example 2 shown in FIG. 10 "c", the first branched structures B1 and the second branched structures B2 are symmetrically disposed about the main waveguide 700 of the coaxial waveguide distributor 600. That is, the first branched structures B1 and the second branched structures B2 are connected to the main waveguide 700 in the order of the first branched structures B1 and the second branched structures B2 from the second coaxial waveguide (the input portion In) toward both sides of the second coaxial waveguide. In this case, the number of cells is 12 (=6×2).

A pitch between a connection portion where a first branched structure B1 is connected to the main waveguide 700 of the coaxial waveguide distributor 600 and a connection portion where a second branched structure B2 is connected to the main waveguide 700 of the coaxial waveguide distributor 600 is 2πn rad (n is an integer, and here, n=1), excluding a pitch between connection portions around the input portion In.

A length between a portion connected to the input portion In and a portion connected to a first branched structure B1 is freely determined. Meanwhile, a distance from a portion connected to a first branched structure B1 to a portion connected to a second branched structure B2 is 2πn rad (n is an integer). Accordingly, microwaves having the same amplitude can be supplied to cells.

Branched Structure According to Modified Example 3

In a branched structure according to the modified example 3 shown in FIG. 10 "d", the second branched structures B2 and the first branched structures B1 are alternately shown on both sides of the input portion In about the first branched structure B1. In this case, there are 14 (=7×2) cells. Here, a distance between a portion connected to a first branched structure B1 and a portion connected to a second branched structure B2 is 2πn rad (n is an integer). Accordingly, microwaves having the same amplitude can be supplied to cells.

Branched Structure According to Modified Example 4

In a branched structure according to the modified example 4 shown in FIG. 10 "e", the first branched structures B1 are additionally connected to outermost sides of the coaxial waveguide distributor 600 of FIG. 10 "c". In this case, there are 16 (=8×2) cells. Even in this case, a length between a portion connected to the input portion In and a portion connected to a first branched structure B1 is freely determined. A distance between a portion connected to a first branched structure B1 and a portion connected to the second branched structure B2 is 2πn rad (n is an integer). Accordingly, microwaves having the same amplitude can be supplied to cells.

In the branched structures shown in FIG. 10 "a" through FIG. 10 "c", there is only one place on each side of the input portion In, where the distance of 2πn rad should be maintained. Meanwhile, in the branched structures of FIG. 10 "d" and FIG. 10 "e", there are two places on each side of the input portion In, where the distance of 2πn rad should be managed.

An allowed frequency range of the microwave source 900 is determined based on characteristics of a magnetron. With respect to the one place at which a pitch should be managed shown in FIG. 10 "*a*" through FIG. 10 "*c*", an allowed frequency range of the microwave source 900 is about ±1% of a reference frequency. With respect to the two places at which a pitch should be managed shown in FIG. 10 "*d*" and FIG. 10 "*e*", an allowed frequency range of the microwave source 900 is about ±0.5% of a reference frequency, which is half of that in FIG. 10 "*a*" through FIG. 10 "*c*".

From the above, apparatuses of FIG. 10 "*a*" through FIG. 10 "*c*" in which 4, 5 or 6 cells exist a horizontal direction are more simply managed and more easily equally distribute microwaves than apparatuses of FIG. 10 "*d*" and FIG. 10 "*e*" in which 7 or 8 cells exist in a horizontal direction.

Branched Structure According to Modified Example 5

Figure 11:
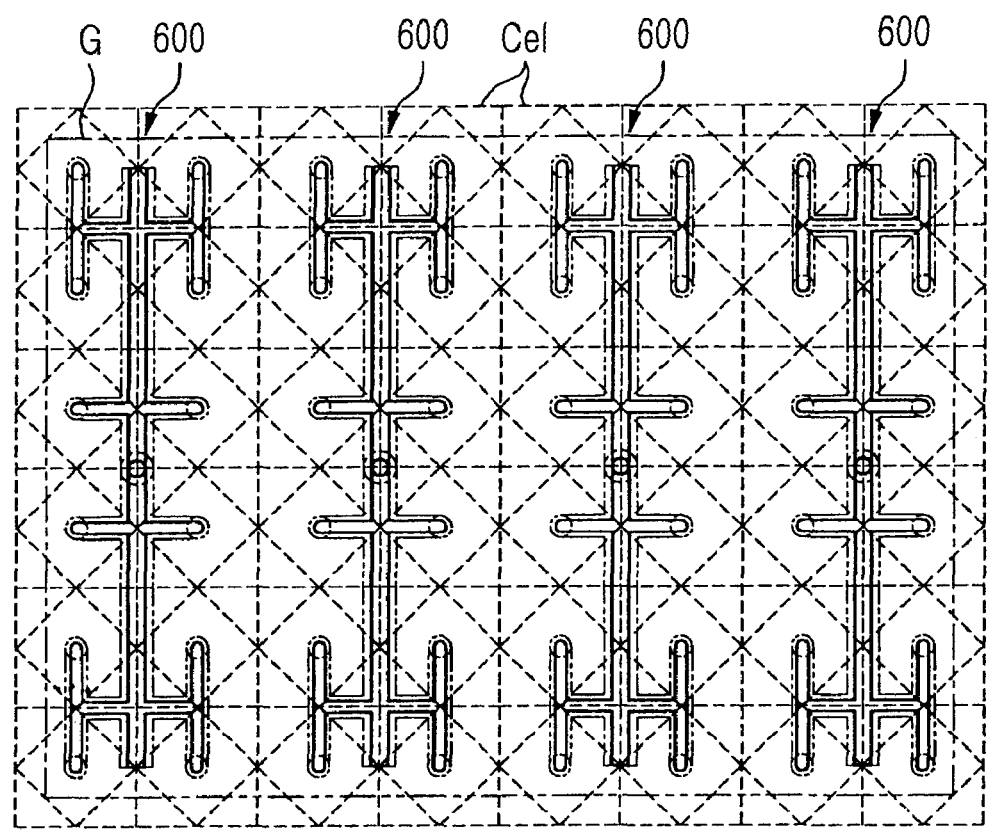
FIG. 11 shows an example of the branched structure applied to a substrate for a solar cell according to the embodiment of the present invention.

In a modified example 5 shown in FIG. 11, 4 coaxial waveguide distributors 600 of FIG. 10 "*c*" are arranged in parallel. Accordingly, a plasma excitation region suitable for a solar cell substrate size of 1.20 m×1.64 m can be secured.

Branched Structure According to Modified Example 6

Figure 12:
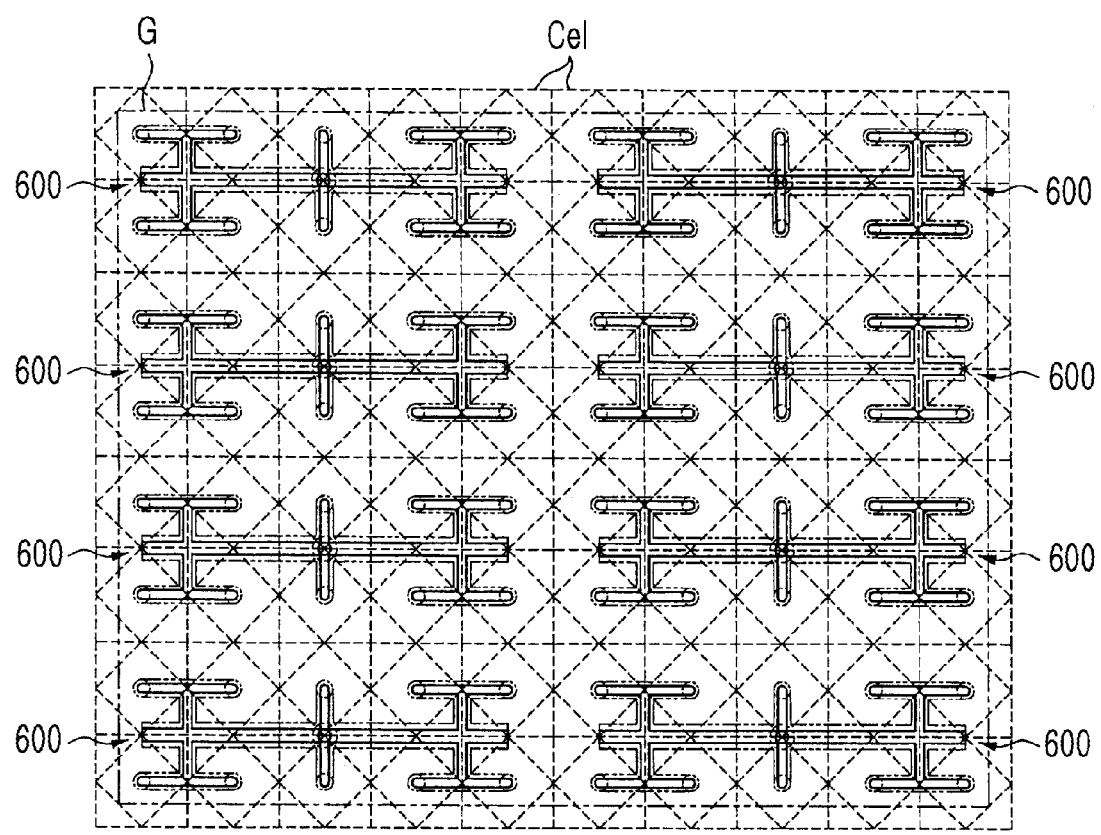
FIG. 12 shows another example of the branched structure applied to a substrate for a solar cell according to the embodiment of the present invention.

In a modified example 6 shown in FIG. 12, total 8 coaxial waveguide distributors 600 of FIG. 10 "*b*" are arranged, 4 each in a vertical direction. Accordingly, a plasma excitation region suitable for a solar cell substrate size of 1.64 m×2.08 m can be secured.

While the present invention has been particularly shown and described with reference to exemplary embodiments thereof using specific terms, the embodiments and terms have been used to explain the present invention and should not be construed as limiting the scope of the present invention defined by the claims. Accordingly, it will be understood by those of ordinary skill in the art that various changes in form and details may be made therein without departing from the spirit and scope of the present invention as defined by the following claims.

For example, a phase adjustment unit may not be provided at the same position as a characteristic impedance conversion unit. If the phase adjustment unit is provided at a position different from that of the characteristic impedance conversion unit, the phase adjustment unit may adjust only a phase. Also, the phase adjustment unit may be provided on a coaxial waveguide other than a first coaxial waveguide.

In each of the embodiments described above, the microwave source 600, which outputs microwaves at 915 MHz, is used, but alternatively, a microwave source that outputs microwaves at 896 MHz, 992 MHz, 2.45 GHz, or the like may be used. Also, the microwave source is an example of an electromagnetic wave source that generates electromagnetic waves for exciting plasma. A magnetron or high frequency power source that outputs electromagnetic waves having a frequency of 100 MHz or more may be used as an electromagnetic wave source.

Also, a plasma processing apparatus according to the present invention is not limited to the aforesaid microwave plasma processing apparatus and may be a plasma processing apparatus that performs micro processing, such as film formation, diffusion, etching, ashing, plasma doping, or the like, on an object to be processed by using plasma.

Also, for example, a plasma processing apparatus according to the present invention may process a glass substrate having a large area, a silicon wafer having a circular shape, or an SOI (Silicon On Insulator) substrate having a polygonal shape.

The invention claimed is:

1. A plasma processing apparatus for plasma-processing an object to be processed by exciting a gas by using electromagnetic waves, the plasma processing apparatus comprising:
   a processing container;
   an electromagnetic wave source which outputs electromagnetic waves;
   a transmission line through which the electromagnetic waves output from the electromagnetic wave source are transmitted;
   a plurality of dielectric plates which are arranged on an inner surface of the processing container and through which the electromagnetic waves are emitted into the processing container;
   at least three first coaxial waveguides which are adjacent to the plurality of dielectric plates and through which the electromagnetic waves are transmitted to the plurality of dielectric plates;
   wherein a first dielectric member is buried in at least one of the at least three first coaxial waveguides, and
   a coaxial waveguide distributor which distributes and transmits the electromagnetic waves transmitted through the transmission line to the at least three first coaxial waveguides,
   wherein the coaxial waveguide distributor comprises: a main coaxial waveguide, at least one third coaxial waveguides connected to a first connection portion of the main coaxial waveguide, and at least one fourth coaxial waveguides connected to a second connection portion of the main coaxial waveguide, and
   the at least one fourth coaxial waveguides and at least two of the at least three first coaxial waveguides are connected to each other by one-to-many correspondence via a fifth coaxial waveguide, and the at least one third coaxial waveguides and remaining of the at least three first coaxial waveguides are connected to each other by one-to-one correspondence;
   wherein the at least three first coaxial waveguides are connected at regular pitches respectively to the plurality of dielectric plates, and
   wherein the first, the third, the fourth and the fifth coaxial waveguides are connected to the electromagnetic wave source.

2. The plasma processing apparatus of claim 1, further comprising a second coaxial waveguide having an input portion via which the second coaxial waveguide is connected to the main coaxial waveguide.

3. The plasma processing apparatus of claim 2, wherein the third coaxial waveguides and the fourth coaxial waveguides are alternately connected to the main coaxial waveguide away from a connecting point between the second coaxial waveguide and the main coaxial waveguide.

4. The plasma processing apparatus of claim 2, wherein the third coaxial waveguides and the fourth coaxial waveguides are connected to the main coaxial waveguide symmetrically about the second coaxial waveguide.

5. The plasma processing apparatus of claim 1, wherein the third coaxial waveguides and the fourth coaxial waveguides are alternately connected to the main coaxial waveguide.

6. The plasma processing apparatus of claim 1, wherein a pitch between the first connection portion and the second connection portion is $2\pi n$ rad (n is an integer) in an electric length.

7. The plasma processing apparatus of claim 1, wherein the first dielectric member has a tapered shape whose diameter becomes smaller along a transmission direction of the electromagnetic waves.

8. The plasma processing apparatus of claim 7, wherein the first dielectric member is interposed between an inner conductor and an outer conductor of the first coaxial waveguide.

9. The plasma processing apparatus of claim 8, an external diameter of the inner conductor is constant and an internal diameter of the outer conductor is constant.

10. The plasma processing apparatus of claim 1, wherein the first dielectric member adjusts a characteristic impedance of the first coaxial waveguide according to a shape of the first dielectric member.

11. The plasma processing apparatus of claim 1, wherein an electric length of the first coaxial waveguide is adjusted according to a length of the first dielectric member.

12. The plasma processing apparatus of claim 1, wherein each pitch is $4\pi n/3$ rad (n is an integer) in reference to an electric length of the main coaxial waveguide.

13. The plasma processing apparatus of claim 1, the main coaxial waveguide, the third coaxial waveguides, the fourth coaxial waveguides, and the fifth coaxial waveguide extend to a direction which is parallel to the dielectric plate, and the at least three first coaxial waveguides extend to a direction which is perpendicular to the plurality of dielectric plates.

14. The plasma processing apparatus of claim 1, further comprising:

a plurality of second coaxial waveguides, wherein a plurality of the main coaxial waveguides are provided, and each of the second coaxial waveguides has an input portion via which the each of the second coaxial waveguides is connected to each of the main coaxial waveguides; and a waveguide which transmits the electromagnetic waves, which is output from the electromagnetic wave source, to the plurality of second coaxial waveguides.

* * * * *